United States Patent
Kim et al.

(10) Patent No.: US 9,053,948 B2
(45) Date of Patent: Jun. 9, 2015

(54) SEMICONDUCTOR DEVICES

(71) Applicant: Samsung Electronics Co., Ltd., Suwon-si, Gyeonggi-do (KR)

(72) Inventors: Kyoung-Hee Kim, Incheon (KR); Ho-Ki Lee, Seongnam-si (KR); Gilheyun Choi, Seoul (KR); Kyu-Hee Han, Hwaseong-si (KR); Jongwon Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/256,232

(22) Filed: Apr. 18, 2014

(65) Prior Publication Data

US 2014/0312456 A1 Oct. 23, 2014

(30) Foreign Application Priority Data

Apr. 22, 2013 (KR) .................. 10-2013-0044320

(51) Int. Cl.
*H01L 29/06* (2006.01)
*H01L 21/764* (2006.01)
*H01L 23/522* (2006.01)
*H01L 23/532* (2006.01)

(52) U.S. Cl.
CPC .......... *H01L 29/0649* (2013.01); *H01L 21/764* (2013.01); *H01L 23/5222* (2013.01); *H01L 23/53238* (2013.01); *H01L 23/53266* (2013.01); *H01L 23/5329* (2013.01); *H01L 23/53295* (2013.01); *H01L 2924/0002* (2013.01)

(58) Field of Classification Search
CPC ............ H01L 29/0649; H01L 23/5222; H01L 21/764; H01L 23/53238; H01L 23/53266; H01L 23/5329; H01L 23/53295
See application file for complete search history.

(56) References Cited

U.S. PATENT DOCUMENTS

| | | |
|---|---|---|
| 6,873,052 B2 | 3/2005 | Aoi |
| 6,963,137 B2 | 11/2005 | Giles |
| 6,995,470 B2 | 2/2006 | Ahn et al. |
| 7,057,287 B2 | 6/2006 | Kumar et al. |
| 7,067,421 B2 | 6/2006 | Ahn et al. |
| 7,091,611 B2 | 8/2006 | Ahn et al. |
| 7,262,505 B2 | 8/2007 | Ahn et al. |
| 7,301,107 B2 | 11/2007 | Karthikeyan et al. |
| 7,402,516 B2 | 7/2008 | Ahn et al. |
| 7,795,142 B2 | 9/2010 | Masuda et al. |
| 7,838,440 B2 | 11/2010 | Park |
| 7,936,068 B2 | 5/2011 | Usami |
| 2007/0035816 A1 | 2/2007 | Daamen et al. |
| 2009/0280637 A1 | 11/2009 | Lee et al. |
| 2010/0102452 A1 | 4/2010 | Nakao |
| 2011/0147882 A1 | 6/2011 | Tsutsue |

FOREIGN PATENT DOCUMENTS

| | | |
|---|---|---|
| JP | 2010-129950 | 6/2010 |
| JP | 2011-109036 | 6/2011 |
| JP | 2011-124351 | 6/2011 |
| JP | 2011-254049 | 12/2011 |
| KR | 1020060079317 A | 7/2006 |

*Primary Examiner* — Long Pham
(74) *Attorney, Agent, or Firm* — Myers Bigel Sibley & Sajovec, P.A.

(57) ABSTRACT

A semiconductor device can include wiring lines on a substrate and an interlayer insulating structure, between ones of the wiring lines. The wiring lines can include a pore-containing layer that includes a plurality of pores extending away from a surface of the substrate, wherein ones of the pores have respective volumes that increase with a distance from the substrate until reaching an air gap layer above the pore-containing layer and beneath uppermost surfaces of the wiring lines.

14 Claims, 7 Drawing Sheets

SEMICONDUCTOR DEVICES

CROSS-REFERENCE TO RELATED APPLICATIONS

This U.S. non-provisional patent application claims priority under 35 U.S.C. §119 to Korean Patent Application No. 10-2013-0044320, filed on Apr. 22, 2013, in the Korean Intellectual Property Office, the entire contents of which are hereby incorporated by reference.

BACKGROUND

The inventive concept relates to the field of semiconductor devices and in particular, to interconnection structures in semiconductor devices.

Some examples of semiconductor devices include a memory device for storing data, a logic device for processing data, and a hybrid device capable of performing various memory storage and data processing functions.

Semiconductor devices may operate at high speed and/or relatively low voltage. To provide desired operating characteristics, a semiconductor device may have a highly integrated density, that is, may have increased elements per area. However, an increase in the integration density may lead to a decrease in the reliability of the semiconductor device. For example, in a Back-End-Of-Line (BEOL) step, copper (Cu) lines of a semiconductor device may be formed, however as the pitch of the interconnection lines decreases, the semiconductor device may suffer from an RC delay problem. To overcome this problem, a low-k dielectric material has been used as an inter-media dielectric (IMD). For example, an IMD structure having an air gap has been used. When the air gap is formed, however, various problems may arise. For example, if the interconnection lines have a large pitch, they may collapse. Otherwise, an insulating material may be absent, and thus, the device may suffer from low reliability.

SUMMARY

According to example embodiments of the inventive concepts, a semiconductor device can include wiring lines on a substrate and an interlayer insulating structure, between ones of the wiring lines. The wiring lines can include a pore-containing layer that includes a plurality of pores extending away from a surface of the substrate, wherein ones of the pores have respective volumes that increase with a distance from the substrate until reaching an air gap layer above the pore-containing layer and beneath uppermost surfaces of the wiring lines.

In some embodiments according to the inventive concept, a semiconductor device can include wiring lines on a substrate and an interlayer insulating structure between ones of the wiring lines. A cover layer can cover the wiring lines and the interlayer insulating structure, wherein the interlayer insulating structure includes a non-porous layer without pores, a pore-containing layer with pores, and an air gap sequentially provided on the substrate, wherein respective volumes of the pores in the pore-containing layer increase monotonically with increased distance from a surface of the substrate.

In some embodiments according to the inventive concept, the cover layer can be a silicon oxycarbide based material. In some embodiments according to the inventive concept, the wiring lines can be tungsten or copper. In some embodiments according to the inventive concept, the device can further include a barrier layer between the substrate and at least one of the wiring lines and between the interlayer insulating structure and the at least one wiring line.

In some embodiments according to the inventive concept, at least one wiring line can be tungsten, and the barrier layer can be a metal barrier layer. In some embodiments according to the inventive concept, the metal barrier layer can be at least one of tantalum, tantalum nitride, ruthenium, cobalt, manganese, titanium, titanium nitride, tungsten nitride, nickel, nickel boron, or any combination thereof.

In some embodiments according to the inventive concept, the at least one wiring line can be copper, and the barrier layer can be a multi-layered structure including a metal barrier layer and a seed layer on the metal barrier layer. In some embodiments according to the inventive concept, the device can also include an etch stop layer between the substrate and the interlayer insulating structure. In some embodiments according to the inventive concept, the etch stop layer can be silicon carbon nitride.

In some embodiments according to the inventive concept, a method of fabricating a semiconductor device can be provided by depositing an interlayer insulating layer on a substrate while monotonically increasing an amount of porogen gas applied to the interlayer insulating layer from about 0% to about 100% of a source material. An interconnection line can be formed to penetrate the interlayer insulating layer. A cover layer can be formed on the interconnection line and the interlayer insulating layer and porogen can be removed from the interlayer insulating layer to form an interlayer insulating structure including a non-porous layer without pores, a pore-containing layer with pores, and an air gap sequentially provided on the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
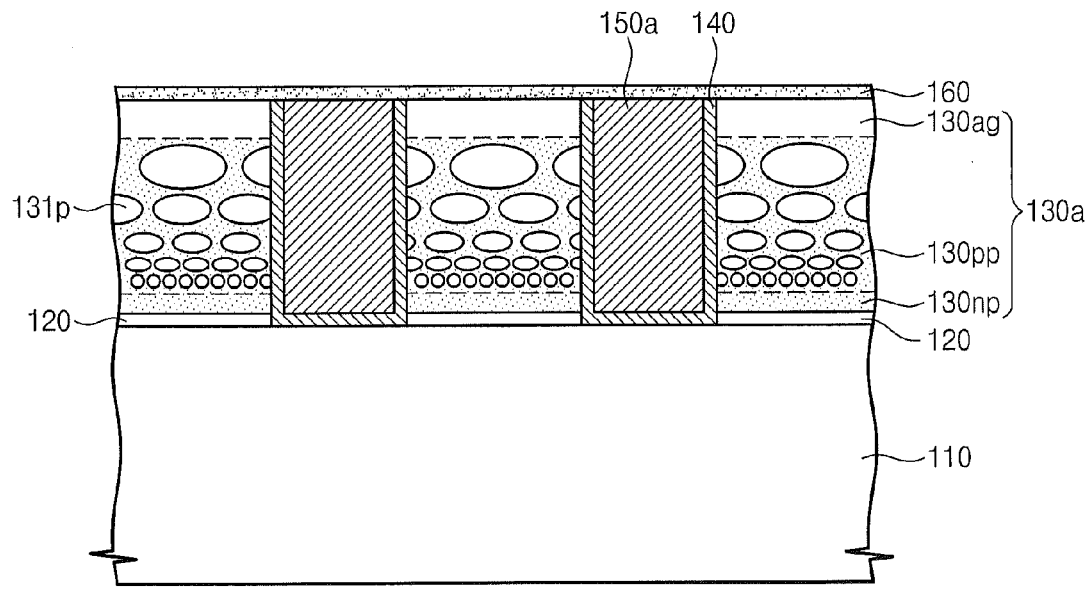
FIG. 1 is a sectional view illustrating a semiconductor device according to some embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of some embodiments to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor device according to example embodiments of the inventive concept.

Referring to FIG. 1, a semiconductor device may include a substrate 110, an etch stop layer 120, an interlayer insulating structure 130a, a barrier layer 140, a wiring pattern 150a, and a cover layer 160.

The substrate 110 may be a semiconductor wafer, such as a silicon (Si) wafer, a germanium (Ge) wafer, or a silicon-germanium (SiGe) wafer. Other wafers may also be used. Integrated circuits including transistors and/or memory cells may be provided between the substrate 110 and the interlayer insulating structure 130a or on the substrate 110.

The etch stop layer 120 may be interposed between the substrate 110 and the interlayer insulating structure 130a. The etch stop layer 120 may include a material having an etch selectivity with respect to the material comprising the interlayer insulating structure 130a that is sufficient to enable the formation of the structure shown in FIG. 1 using an etch chemistry. For example, the etch stop layer 120 may include silicon carbon nitride (SiCN). Due to the presence of the etch stop layer 120, it is possible to suppress an increase in etching uniformity of the substrate 110, in a process of forming the wiring patterns 150a.

The interlayer insulating structure 130a may include a non-porous layer 130np without a pore, a pore-containing layer 130pp with pores 131p, and an air gap 130ag. In example embodiments, the non-porous layer 130np, the pore-containing layer 130pp, and the air gap 130ag may be sequentially disposed on the substrate 110. Further, the pores 131p may be formed to have volumes that increase with the distance from a surface of the substrate 110 on which the interlayer insulation structure 130a is formed. In some embodiments according to the inventive concept, the volumes of the pores 131p may increase monotonically as the distance from the substrate 110 increases. In some embodiments according to the inventive concept, the term "increasing monotonically" can refer to embodiments where the volumes of the pores 131p increase (without decreasing) with the distance from the surface of the substrate 110. For example, "increasing monotonically" can describe an embodiment where the volumes of the pores 131p increase with the distance from the substrate 110 surface and do not decrease, as the distance from the substrate 110 surface increases. Furthermore, the term "increasing monotonically" can include embodiments where the volumes of the pores 131p increase through some portions of the structure 130a as the distance increases and remains the same through other portions of the structure 130a as the distance increases, but the volumes do not decrease as the distance increases. Here, the pores 131p and/or the air gap 130ag may be voids such that all liquid and/or solids are absent from inside the pores 131p. For example, the pores 131p and/or the air gap 130ag may be empty spaces. In some embodiments according to the inventive concept, the material that surrounds the pores 131p is absent from inside the volumes that define the pores. The non-porous layer 130np and the pore-containing layer 130pp may include a low-k material. For example, the non-porous layer 130np and the pore-containing layer 130pp may include silicon carbide (SiC).

In some embodiments according to the inventive concept, the pores 131p can be formed at any higher density in the structure as the distance from the surface of the substrate 110 increases. For example, in some embodiments according to the inventive concept, as the distance from the surface of the substrate 110 increases, the volumes of the pores 131p can also increase so that less of the interlayer insulating structure 130a is available so that the pores 131p consume a greater volume of the structure 130a as the distance increases.

The wiring pattern 150a may include tungsten (W) or copper (Cu). The wiring pattern 150a may be electrically connected to the transistors and/or the memory cells. The barrier layer 140 may be interposed between the substrate 110 and the wiring pattern 150a and between the interlayer insulating structure 130a and the wiring pattern 150a. The barrier layer 140 may prevent metallic elements in the wiring pattern 150a from being diffused into the substrate 110 and/or the interlayer insulating structure 130a. This wiring pattern 150a includes wiring lines that are spread apart from one another. The interlayer insulate structure 130a is located between ones of the wiring lines.

In the case where the wiring pattern 150a contains tungsten, the barrier layer 140 may be a metal barrier layer. For example, the barrier layer 140 may include at least one selected from the group consisting of tantalum (Ta), tantalum nitride (TaN), ruthenium (Ru), cobalt (Co), manganese (Mn), titanium (Ti), titanium nitride (TiN), tungsten nitride (WN), nickel (Ni), nickel boron (NiB), and any combination thereof.

In the case where the wiring pattern 150a contains copper, the barrier layer 140 may be a multi-layered structure including a metal barrier layer and a seed layer on the metal barrier layer. The seed layer may include copper.

The cover layer 160 may be provided to cover the wiring pattern 150a and the interlayer insulating structure 130a. The cover layer 160 may include at least one of silicon oxycarbide (SiOC) based materials. The cover layer 160 may be formed to have a thickness ranging from about 10 Å to about 30 Å. During a process for forming the interlayer insulating structure 130a, polymeric pore generator (porogen) may be evaporated to form the nano-volume or small volume pores. In some embodiments, the cover layer 160 may be formed to have pores allowing the evaporated porogens to be exhausted to the atmosphere.

An interconnection line structure may be additionally provided on the cover layer 160. In example embodiments, the additional interconnection line structure may be configured to be similar to the interlayer insulating structure 130a and the wiring pattern 150a.

In some embodiments, the interlayer insulating structure 130a can include a predetermined thickness pore-free non-porous layer 130np, a predetermined thickness pore-containing layer 130pp, including pores 131p of monotonically-increasing volume with increasing distance from the substrate 110, and a predetermined thickness air gap 130ag that are sequentially provided on the substrate 110. Owing to this structure of the interlayer insulating structure 130a, it is possible to reduce the likelihood that the wiring pattern 150a may collapse during formation. Further, by using the interlayer insulating structure, it is possible to reduce a problem of RC delay.

FIGS. 2 through 8 are sectional views illustrating a method of fabricating a semiconductor device according to some embodiments of the inventive concept.

Figure 2:
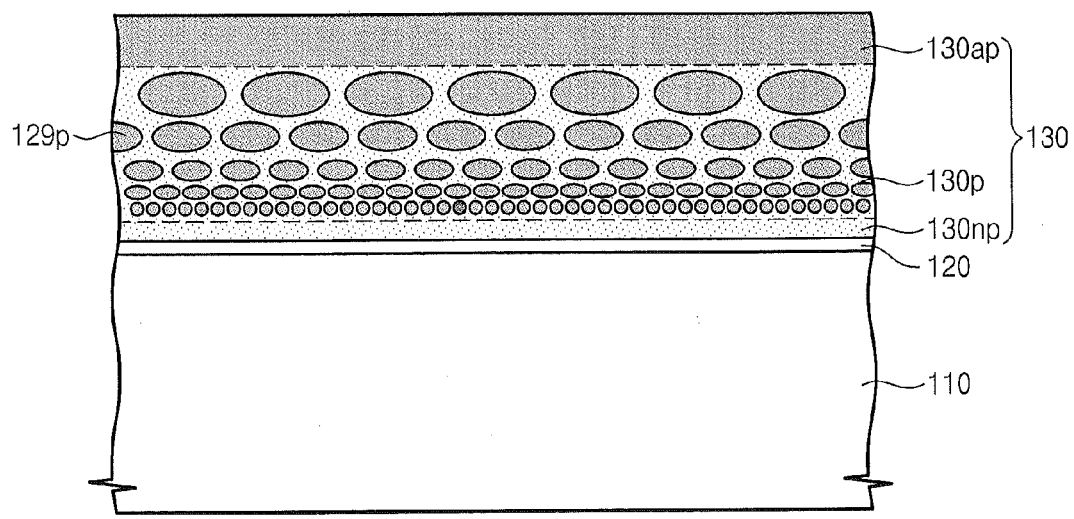
FIGS. 2 through 8 are sectional views illustrating a method of fabricating a semiconductor device according to some embodiments of the inventive concept.

Referring to FIG. 2, the etch stop layer 120 may be formed on the substrate 110, and then, an interlayer insulating layer 130 may be formed on the etch stop layer 120. The interlayer insulating layer 130 may include the non-porous layer 130np, a porogen-containing layer 130p, and a porogen layer 130ap that are sequentially formed on the substrate 110.

The substrate 110 may be a semiconductor wafer, such as a silicon (Si) wafer, a germanium (Ge) wafer, or a silicon-germanium (SiGe) wafer. Integrated circuits including transistors and/or memory cells may be provided between the substrate 110 and the interlayer insulating structure 130a or on the substrate 110.

The etch stop layer 120 may be formed to include a material having an etch selectivity with respect to the interlayer insulating layer 130. For example, the etch stop layer 120 may include silicon carbon nitride. The etch stop layer 120 may make it possible to suppress an increase in etching uniformity of the substrate 110, in a subsequent process of forming the wiring patterns 150a (of FIG. 1).

The interlayer insulating 130 may be formed by providing a source material including a silicon source and a porogen gas. For example, the silicon source includes silane-based materials or methyl silane based materials. The interlayer insulating layer 130 may be formed by monotonically or linearly increasing an amount of porogen gas, for example, from 0% to 100% of the source material during the deposition of the interlayer insulating layer 130. As a result, the interlayer insulating layer 130 may be formed to include the non-porous layer 130np, the porogen-containing layer 130p including porogen portions 129p, and the porogen layer 130ap made of porogen. The porogen portions 129p in the porogen-containing layer 130p may be formed to have volumes that monotonically or linearly increase with increasing distance from the substrate 110. The non-porous layer 130np and the porogen-containing layer 130p may be formed of a low-k material. For example, the non-porous layer 130np and the porogen-containing layer 130p may be formed of silicon carbide. The porogen gas may include at least one of hydrocarbon ($C_xH_y$) based materials, where $x+y=1$. In some embodiments, the interlayer insulating layer 130 may be formed using a chemical vapor deposition method.

Figure 3:
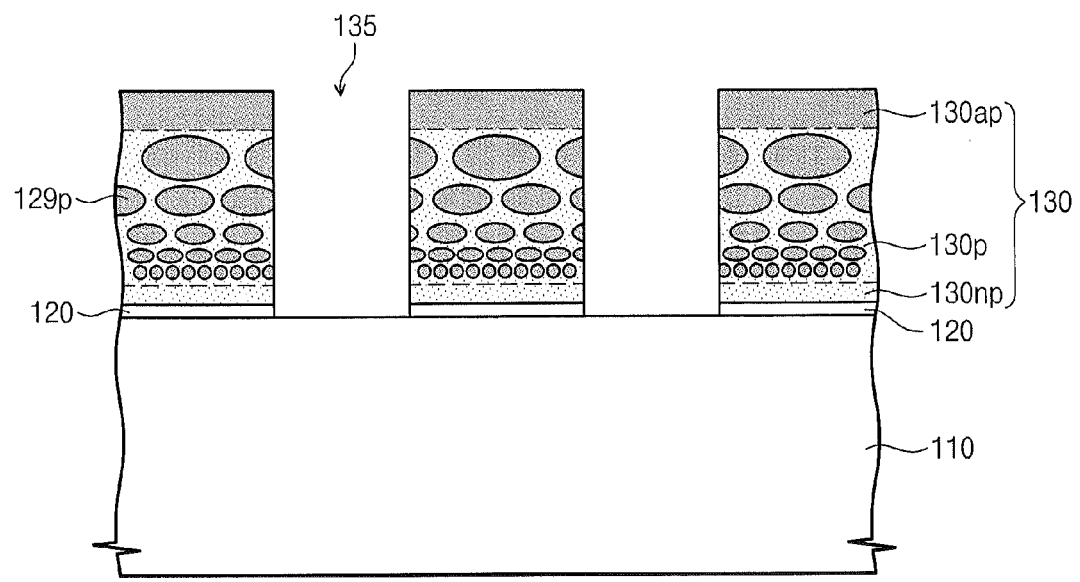

Referring to FIG. 3, an opening 135 may be formed through the interlayer insulating layer 130 to expose a portion of the substrate 110. The formation of the opening 135 may include forming a hardmask pattern on the interlayer insulating layer 130, and then, sequentially etching the interlayer insulating layer 130 and the etch stop layer 120 using the hardmask pattern as an etch mask. Thereafter, the hardmask pattern may be removed.

Figure 4:
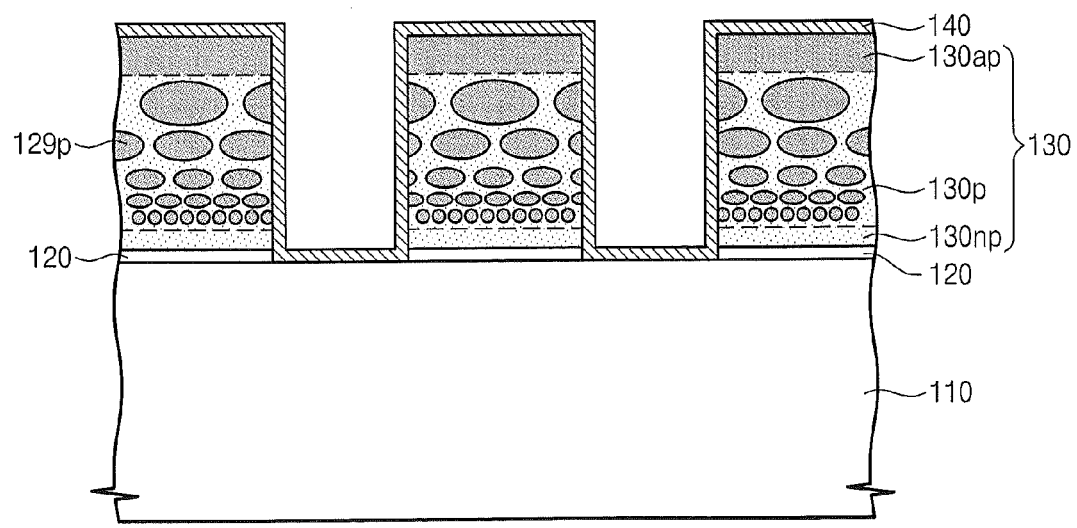

Referring to FIG. 4, the barrier layer 140 may be formed to cover conformally the resulting structure provided with the opening 135. The barrier layer 140 may be a metal barrier layer. The metal barrier layer may include at least one selected from the group consisting of tantalum (Ta), tantalum nitride (TaN), ruthenium (Ru), cobalt (Co), manganese (Mn), titanium (Ti), titanium nitride (TiN), tungsten nitride (WN), nickel (Ni), nickel boron (NiB), and any combination thereof. In addition, the barrier layer 140 may be a multi-layered structure including a metal barrier layer and a seed layer on the metal barrier layer. The seed layer may include copper.

Figure 5:
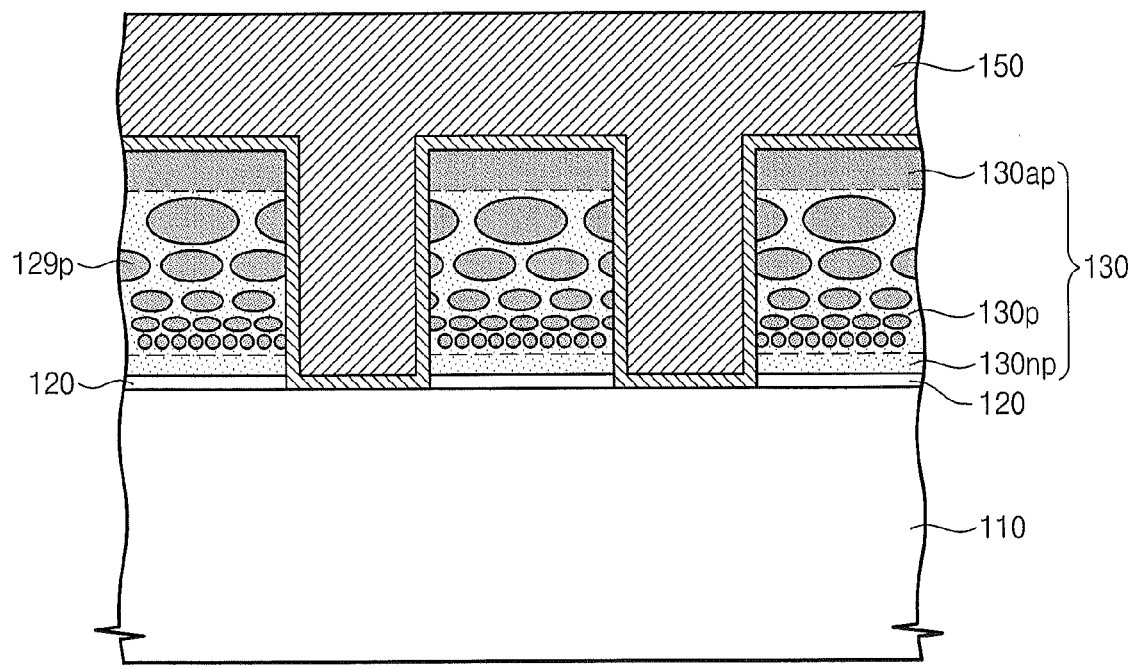

Referring to FIG. 5, a wiring layer 150 may be formed on the resulting structure provided with the barrier layer 140. The wiring layer 150 may include tungsten or copper. The barrier layer 140 may reduce diffusion of metallic elements in the wiring layer 150 into the substrate 110 and/or the interlayer insulating layer 130.

In embodiments where the wiring layer 150 contains tungsten, the barrier layer 140 may be a metal barrier layer. The metal barrier layer may include at least one selected from the group consisting of tantalum (Ta), tantalum nitride (TaN), ruthenium (Ru), cobalt (Co), manganese (Mn), titanium (Ti), titanium nitride (TiN), tungsten nitride (WN), nickel (Ni), nickel boron (NiB), and any combination thereof. In the case where the wiring layer 150 contains tungsten, the wiring layer 150 may be formed by a physical vapor deposition (PVD) or chemical vapor deposition method.

In embodiments where the wiring layer 150 contains copper, the barrier layer 140 may be a multi-layered structure including a metal barrier layer and a seed layer on the metal barrier layer. In embodiments where the wiring layer 150 contains copper, the wiring layer 150 may be formed by an electroplating method.

Figure 6:
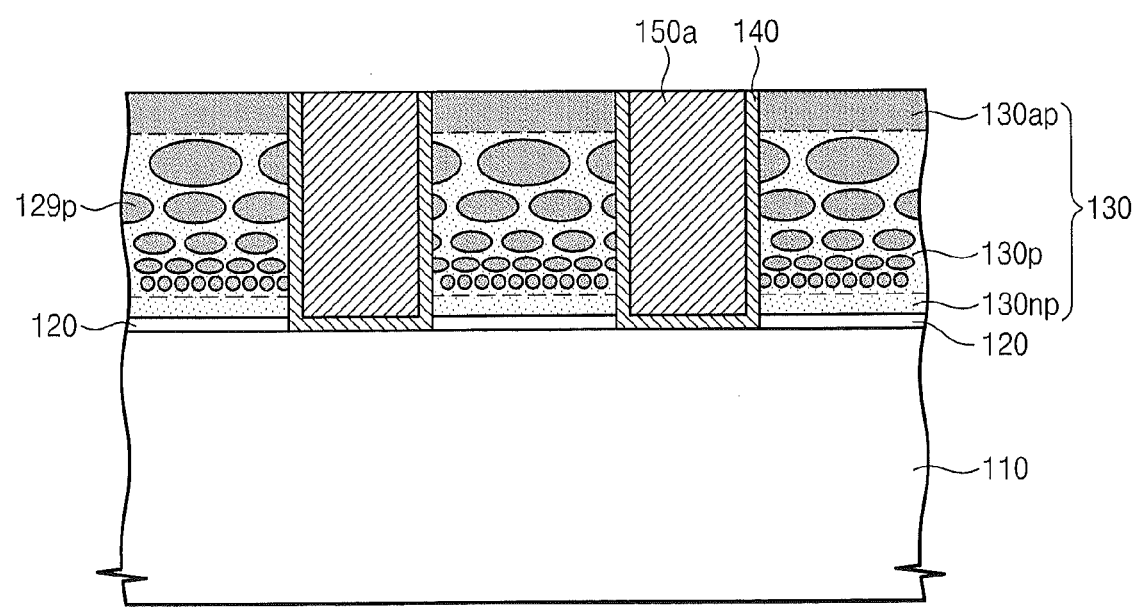

Referring to FIG. 6, the wiring layer 150 may be planarized to expose the interlayer insulating layer 130. Accordingly, the wiring pattern 150a having an exposed top surface may be formed. The wiring pattern 150a may be electrically connected to the transistors and/or the memory cells.

Figure 7:
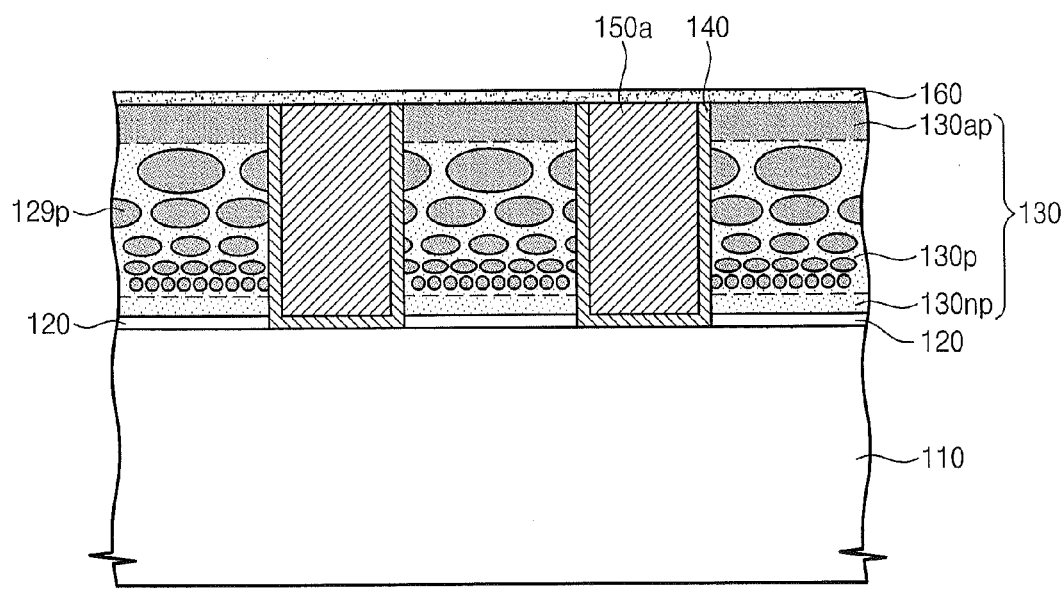

Referring to FIG. 7, the cover layer 160 may be formed to cover the wiring pattern 150a and the interlayer insulating layer 130. The cover layer 160 may be formed of at least one of silicon oxycarbide based materials. The cover layer 160 may be formed to have a thickness ranging from about 10A to about 30A. During a subsequent process for forming the interlayer insulating structure 130a (of FIG. 1), porogens may be evaporated from the porogen portions 129p and the porogen layer 130ap. In some embodiments, the cover layer 160 may be formed to have pores allowing the evaporated porogens to be exhausted to the exterior atmosphere.

Figure 8:
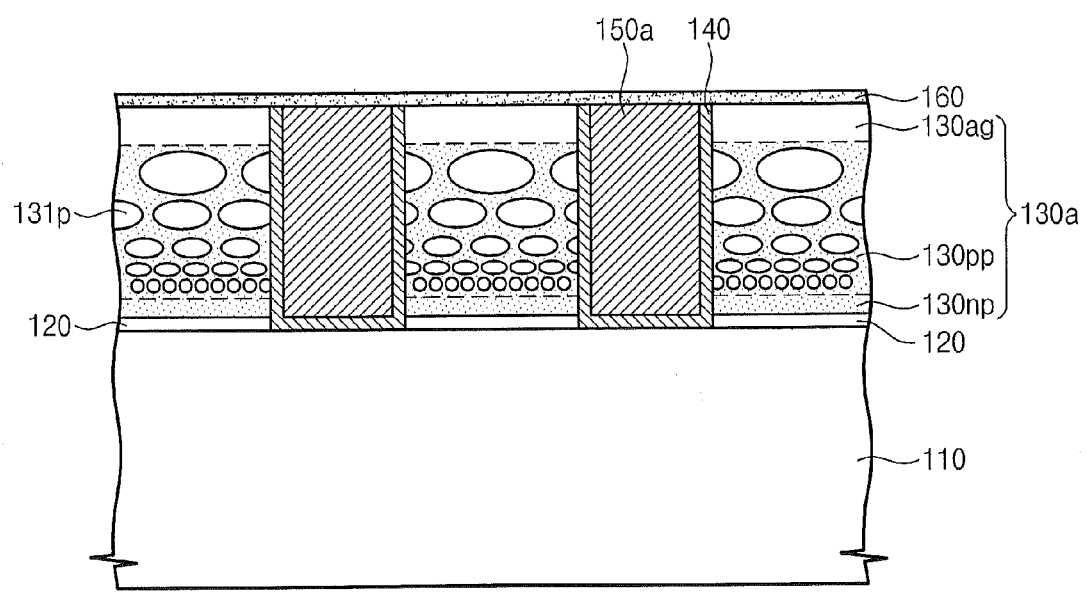

Referring to FIG. 8, the interlayer insulating layer 130 may be cured, thereby forming the interlayer insulating structure 130a including the non-porous layer 130np, the pore-containing layer 130pp with the pores 131p, and the air gap 130ag.

The curing of the interlayer insulating layer 130 may include a high temperature UV process, which may be performed to irradiate ultraviolet (UV) rays to the interlayer insulating layer 130 at a temperature of 400° C. or higher. By performing the high temperature UV process, the porogen layer 130ap and the porogen portions 129p in the porogen-containing layer 130p may be evaporated, and the evaporated porogen may be exhausted to the exterior atmosphere through the pores of the cover layer 160.

As a result, the interlayer insulating structure 130a may be formed to have a pore density (in terms of volumes of respective pores 131p) increasing from bottom to top along a sidewall of the wiring pattern 150a.

An interconnection line structure may be additionally formed on the cover layer 160. In example embodiments, the additional interconnection line structure may be configured to be similar to the interlayer insulating structure 130a and the wiring pattern 150a.

According to the above method, the semiconductor device may be fabricated to include the interlayer insulating structure 130a including the pore-free non-porous layer 130np, the pore-containing layer 130pp (having pores 131p with volumes that monotonically or linearly increase with increasing distance from the substrate 110), and the air gap 130ag. Owing to this structure of the interlayer insulating structure 130a, it is possible to prevent the wiring pattern 150a from falling. Further, by using the interlayer insulating structure 130a, it is possible to reduce a problem of RC delay.

Figure 9:
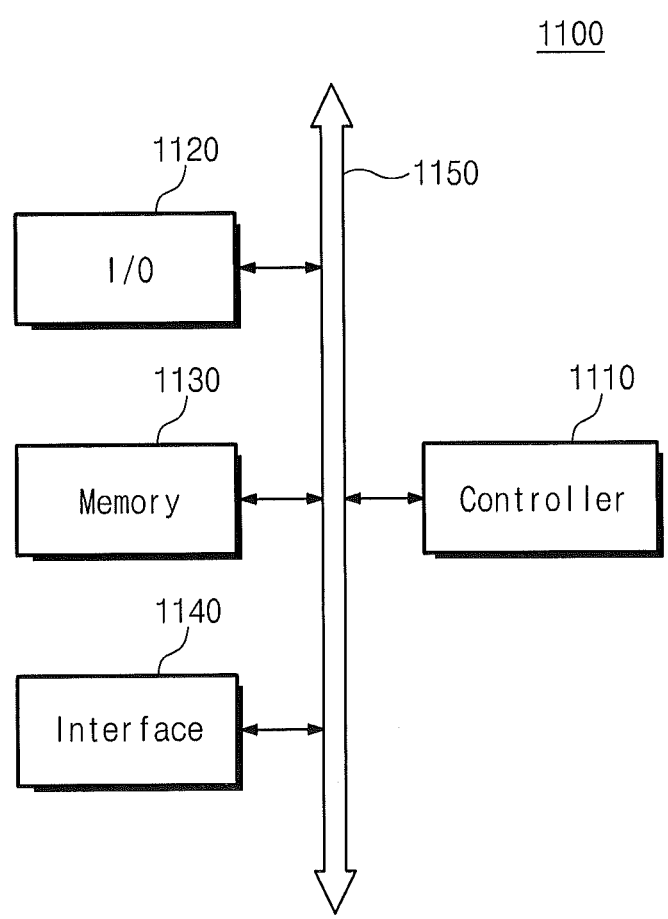
FIG. 9 is a schematic block diagram illustrating an example of memory systems including a semiconductor device according to some embodiments of the inventive concept.

FIG. 9 is a block diagram illustrating an example of a memory system including the semiconductor devices according to some embodiments of the inventive concept.

Referring to FIG. 9, a memory system 1100 can be applied to a personal digital assistant (PDA), a portable computer, a web tablet, a wireless phone, a mobile phone, a digital music player, a memory card and/or any device that can transmit and/or receive data in a wireless communication environment.

The memory system 1100 includes a controller 1110, an input/output device 1120, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other processor devices similar to the microprocessor, the digital signal processor and the micro controller. The memory 1130 may be used to store instructions executed by the controller 1110. The input/output device 1120 can receive data or signals from external to the system 1100 or transmit data or signals from the system 1100. For example, the input/output device 1120 may include a keyboard, a keypad and/or a display.

The memory 1130 includes at least one of the semiconductor devices according to some embodiments of the inventive concepts. The memory 1130 may further include a different kind of memory, a randomly accessible volatile memory device and various kinds of memories.

The interface 1140 transmits data to a communication network or receives data from a communication network.

Figure 10:
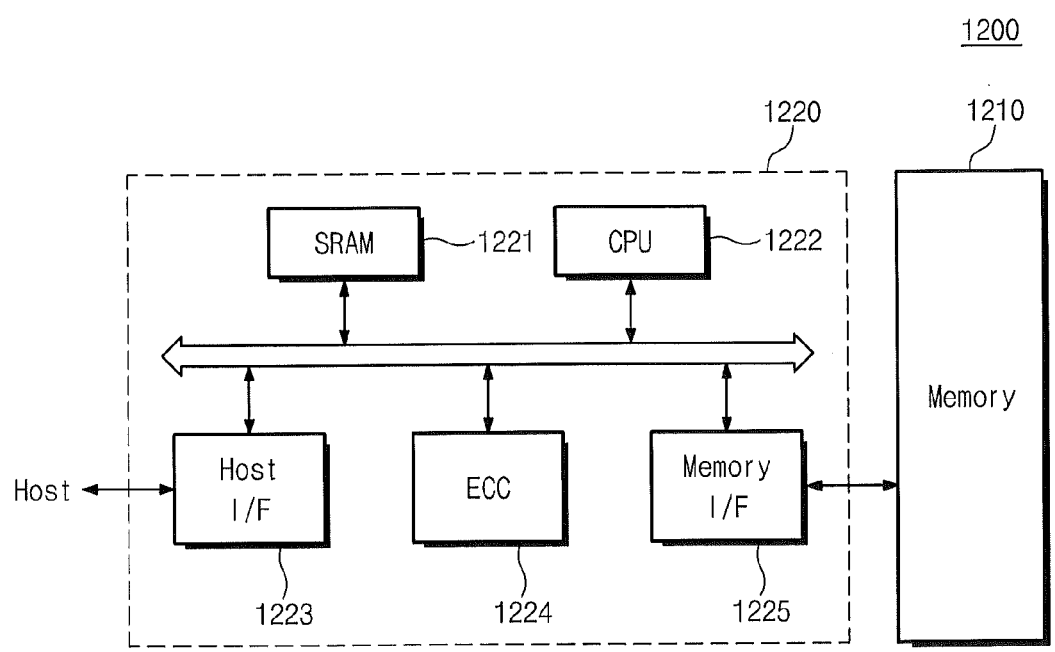
FIG. 10 is a schematic block diagram illustrating an example of memory cards including a semiconductor device according to some embodiments of the inventive concept.

FIG. 10 is a schematic block diagram illustrating an example of a memory card including at least one of the semiconductor devices according to some embodiments of the inventive concept.

Referring to FIG. 10, the memory card 1200 for supporting a storage capability of a large capacity may be configured to include a semiconductor memory device 1210, which may be the semiconductor device according to some embodiments of the inventive concept. The memory card 1200 includes a memory controller 1220 controlling data exchange between a host and the semiconductor memory device 1210.

A static random access memory (SRAM) 1221 is used as an operational memory of a central processing unit (CPU) 1222. A host interface 1223 includes data exchange protocols of a host to be connected to the memory card 1200. An error correction coding block 1224 detects and corrects errors included in data readout from the semiconductor memory device 1210 which may be a multi-bit memory device. A memory interface 1225 interfaces with the semiconductor memory device 1210 including the semiconductor device according to some embodiments of the inventive concept. The CPU 1222 performs control operations for exchanging data of the memory controller 1220. It will be understood that other components can also be provided in the memory card 1200, such as a ROM for storing code data for interfacing with the host.

According to the afore-described example embodiments of the inventive concept, a semiconductor device, a memory card, or a memory system can be provided to have high integration. The example embodiments are applicable to a memory system such as solid state drive (SSD), thereby providing a memory system with high integration.

Figure 11:
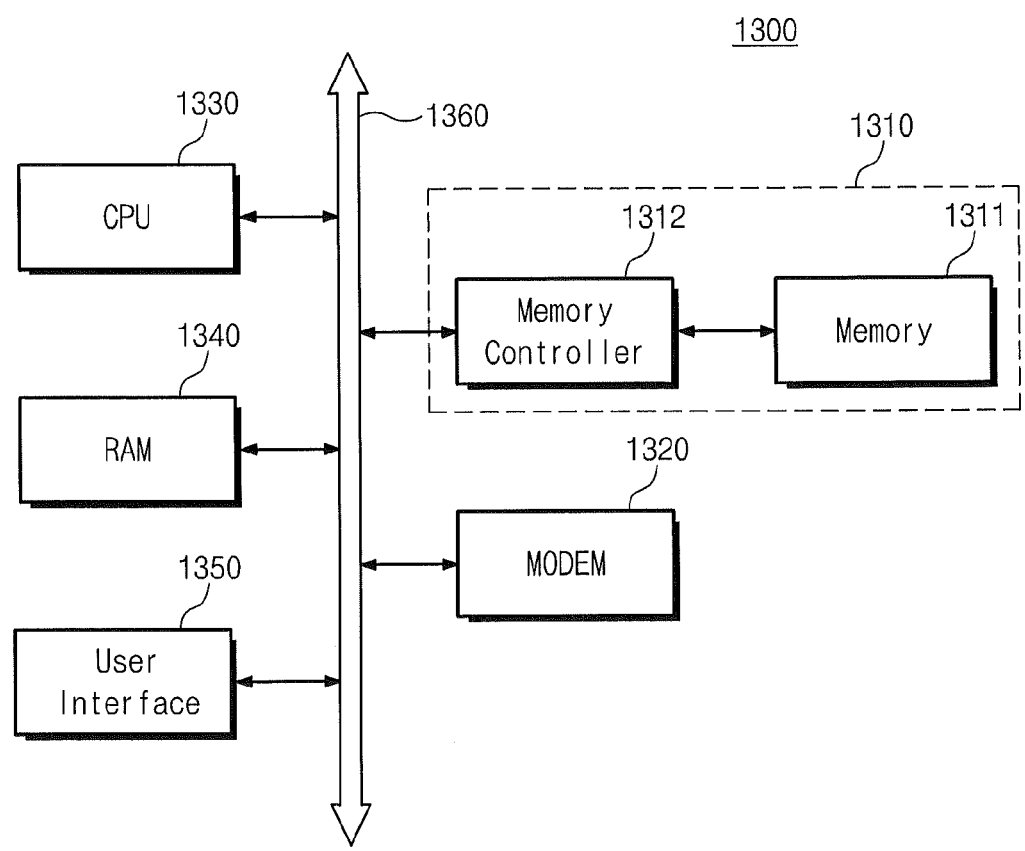
FIG. 11 is a schematic block diagram illustrating an example of information processing systems including a semiconductor device according to some embodiments of the inventive concept.

FIG. 11 is a schematic block diagram illustrating an example of an information processing system 1300 including at least one of the semiconductor devices according to some embodiments of the inventive concept.

Referring to FIG. 11, the information processing system 1300 may be realized using a memory system 1310 including at least one of the semiconductor devices according to some embodiments of the inventive concepts. For instance, the information processing system 1300 may be or be used to realize a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system described with reference to FIG. 9. Data processed by the CPU 1330 and/or input from the outside (e.g., external to the system 1300) may be stored in the memory system 1310. In some embodiments, the memory system 1310 may be used as a portion of a solid state drive (SSD), and in this case, the information processing system 1300 may stably and reliably store a large amount of data in the memory system 1310. It will be understood that other components may also be included in the system 1300, such as an application chipset, a camera image sensor, a camera image signal processor (ISP), an input/output device, or the like.

Furthermore, a semiconductor device according to the inventive concept or a memory system comprising the same may be packaged in various kinds of ways. For instance, the semiconductor device or the memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB) package, Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP). Also, any such package in which a semiconductor memory device according to the inventive concept is incorporated may additionally incorporate at least one semiconductor device (e.g., a controller and/or a logic device) that controls the semiconductor device.

While some embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   wiring lines on a substrate;
   an interlayer insulating structure between ones of the wiring lines; and
   a cover layer covering the wiring lines and the interlayer insulating structure, wherein the interlayer insulating structure comprises a non-porous layer without pores, a pore-containing layer with pores, and an air gap sequentially provided on the substrate, wherein respective volumes of the pores in the pore-containing layer increase monotonically with increased distance from a surface of the substrate.

2. The device of claim 1, wherein the cover layer comprises a silicon oxycarbide based material.

3. The device of claim 1, wherein the wiring lines comprise tungsten or copper.

4. The device of claim 1, further comprising:
   a barrier layer interposed between the substrate and at least one of the wiring lines and between the interlayer insulating structure and the at least one wiring line.

5. The device of claim 4, wherein the at least one wiring line comprises tungsten, and the barrier layer comprises a metal barrier layer.

6. The device of claim 5, wherein the metal barrier layer comprises at least one of tantalum, tantalum nitride, ruthenium, cobalt, manganese, titanium, titanium nitride, tungsten nitride, nickel, nickel boron, or any combination thereof.

7. The device of claim 4, wherein the at least one wiring line comprises copper, and the barrier layer comprises a multi-layered structure including a metal barrier layer and a seed layer on the metal barrier layer.

8. The device of claim 1, further comprising:
   an etch stop layer interposed between the substrate and the interlayer insulating structure.

9. The device of claim 8, wherein the etch stop layer comprises silicon carbon nitride.

10. A semiconductor device, comprising:
    wiring lines on a substrate; and
    an interlayer insulating structure, between ones of the wiring lines, including a pore-containing layer including a plurality of pores extending away from a surface of the substrate, wherein ones of the pores have respective volumes that increase with a distance from the substrate until reaching an air gap layer above the pore-containing layer and beneath uppermost surfaces of the wiring lines.

11. The device of claim 10 wherein the air gap layer extends substantially completely between the ones of the wiring lines above the pore-containing layer.

12. The device of claim 11 wherein the interlayer insulating structure further comprises a non-porous layer without pores between the pore-containing layer and the substrate.

13. The device of claim 10, further comprising a silicon oxycarbide cover layer covering the wiring lines and the interlayer insulating structure.

14. The device of. Claim 12 wherein the volumes of the pores adjacent the air gap are larger than the volumes of the pores adjacent the non-porous layer.

* * * * *